(12) United States Patent
Lee et al.

(10) Patent No.: US 7,348,789 B2
(45) Date of Patent: Mar. 25, 2008

(54) INTEGRATED CIRCUIT DEVICE WITH ON-CHIP SETUP/HOLD MEASURING CIRCUIT

(75) Inventors: Jong-Eon Lee, Gyeonggi-do (KR); Young-Hyun Jun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 10/972,119

(22) Filed: Oct. 21, 2004

(65) Prior Publication Data
US 2005/0094448 A1    May 5, 2005

(30) Foreign Application Priority Data
Nov. 4, 2003    (KR) ...................... 10-2003-0077638

(51) Int. Cl.
*G01R 31/02* (2006.01)
(52) U.S. Cl. ...................................... 324/763
(58) Field of Classification Search ..................... None
See application file for complete search history.

(56) References Cited

U.S. PATENT DOCUMENTS

| 4,578,705 | A | * | 3/1986 | Elmis et al. ................. 348/525 |
| 4,998,025 | A | * | 3/1991 | Watanabe .................... 327/141 |
| 5,065,091 | A | * | 11/1991 | Tobita ......................... 324/763 |
| 5,590,137 | A |   | 12/1996 | Yamashita |
| 5,619,463 | A | * | 4/1997 | Malhi ......................... 365/201 |
| 6,052,810 | A | * | 4/2000 | Creek .......................... 714/740 |
| 6,208,158 | B1 | * | 3/2001 | Schein et al. ................ 324/761 |
| 6,529,030 | B1 |   | 3/2003 | Ishii |
| 6,603,327 | B2 | * | 8/2003 | Seubert ....................... 324/765 |
| 7,017,091 | B2 | * | 3/2006 | West ........................... 714/724 |
| 7,076,377 | B2 | * | 7/2006 | Kim et al. .................... 702/66 |
| 2005/0149778 | A1 | * | 7/2005 | Tiwari ......................... 714/700 |

FOREIGN PATENT DOCUMENTS

KR    2001-0091110    10/2001

OTHER PUBLICATIONS

English language abstract of Korean Application No. 2001-0091110.

* cited by examiner

*Primary Examiner*—Ha Tran Nguyen
*Assistant Examiner*—Richard Isla-Rodas
(74) *Attorney, Agent, or Firm*—Marger Johnson & McCollom, P.C.

(57) ABSTRACT

An integrated circuit device disclosed herein includes a test device and a setup and hold measuring circuit. The setup and hold measuring circuit generates a reference signal and a data signal in response to an external clock signal in a test mode of operation. The test device receives the data signal in response to a reference signal, and outputs the inputted data signal as a setup and hold determining circuit. One of the reference signal and the data signal is a multiphase signal synchronized with the external clock signal. The setup and hold measuring circuit detects whether the output of the test device indicates a valid value of the data signal, and generates the detected result to the external as a setup/hold timing margin through at least one pad.

20 Claims, 13 Drawing Sheets

US 7,348,789 B2

INTEGRATED CIRCUIT DEVICE WITH ON-CHIP SETUP/HOLD MEASURING CIRCUIT

CROSS-REFERENCE TO RELATED APPLICATIONS

This application claims the priority of Korean Patent Application No. 2003-77638, filed Nov. 4, 2003 in the Korean Intellectual Property Office, the disclosure of which is incorporated herein by reference.

BACKGROUND OF THE INVENTION

1. Field of this Invention

This disclosure relates to an integrated circuit (IC) device, and more particularly, to an on-chip device for measuring a setup and hold timing margin of a high-frequency IC device.

2. Description of Prior Art

Generally, an IC device undergoes an AC characteristic test at the package level. This AC characteristic test can be performed by a conventional tester (or automated test equipment). Examples of the automated test equipment are disclosed in U.S. Pat. No. 5,590,137, entitled "Semiconductor IC tester" and in U.S. Pat. No. 6,529,030, entitled "IC testing apparatus".

As the IC device operation rate increases, automated test equipment may reach limitations of speed and resolution during testing. The limited resolution may prevent most automated test equipment from testing a high-frequency IC device. Improved automated test equipment may be required. However, high-performance automated test equipment consumes valuable space.

Accordingly, the present invention provides an IC device including a device capable of measuring a setup/hold timing margin without a high-performance tester.

BRIEF SUMMARY OF THE INVENTION

The present invention comprises an IC device used for measuring setup and hold timing margin independent of high-performance testers. The invention uses an external clock to generate reference and test data signals used to measure the setup and hold timing margin. Two other external signals are used to enable either a setup or a hold measurement system. The output indicating the setup/hold timing margin of the test device, TE, is shown through PAD0-PADn. A delay locked loop comprising of an adjustable delay line is used to generate plurality of internal signals in response to the external clock signal. A decoder is used to select one of these multi-phase signals from the delay line which become test data. During a setup timing margin test, a detector circuit is used to detect if the test device has received a valid test data relative to the reference clock. On valid test data detection, a counting circuit counts and a new delay is selected from a delay line. This new delay is then used to generate a new test data relative to the clock. The procedure is repeated till the detection circuit indicates an invalid test data output from the test device. At that point, the output of the counter which reflects the delay that caused the invalid data is output to the pads for observation. A similar procedure is repeated for measuring hold timing margin. This on-chip device allows for automatic measurement of setup and hold timing margins with respect to an external clock.

DETAILED DESCRIPTION OF THE PREFERRED EMBODIMENT

Figure 1:
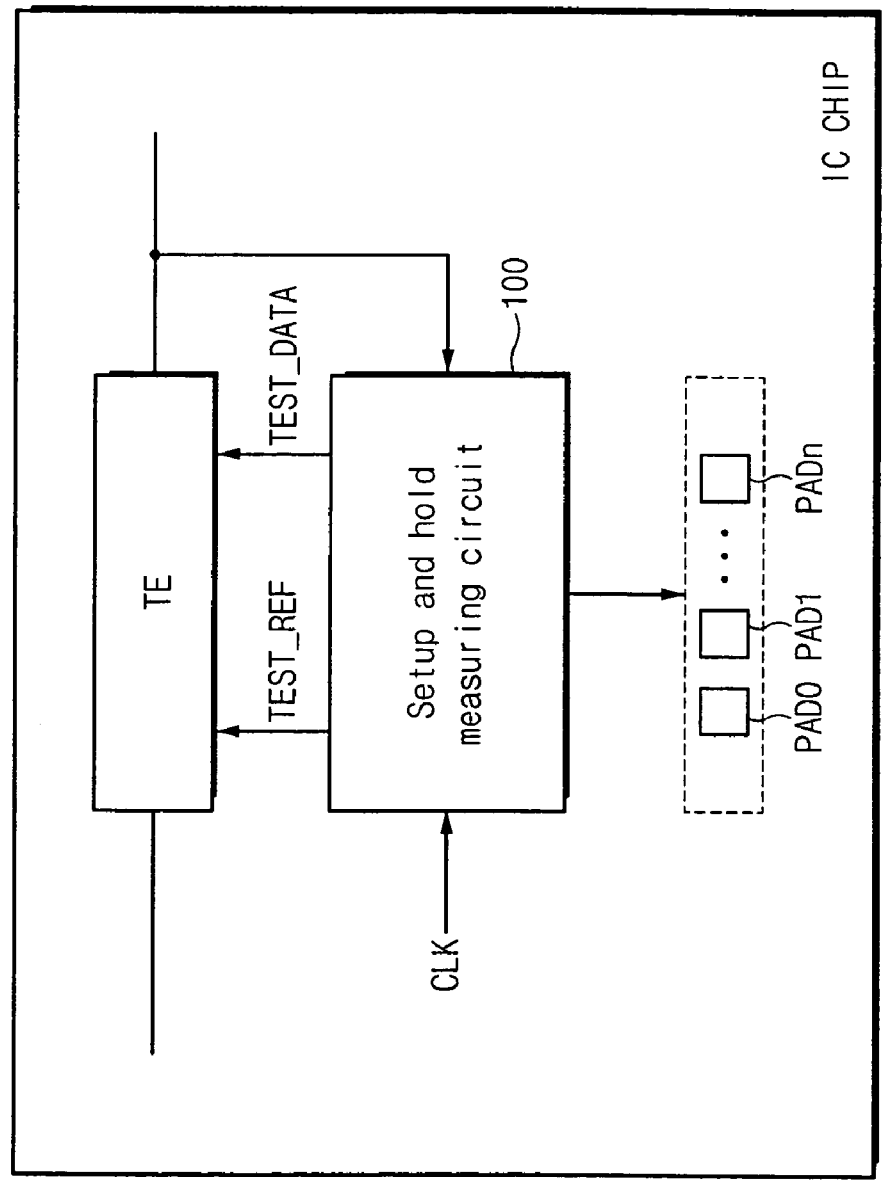
FIG. 1 is a schematic block diagram of an IC device according to the present invention.

FIG. 1 is a schematic block diagram of an IC device according to the present invention. Referring to FIG. 1, the IC device includes a setup and hold measuring circuit 100. The setup and hold measuring circuit 100 receives an externally provided clock signal CLK to generate a data signal TEST_DATA and a reference signal TEST_REF in a test mode of operation. A phase of any one of the data and reference signals TEST_DATA and TEST_REF are shifted by a predetermined time in each cycle. That is, any one of the data and reference signals TEST_DATA and TEST_REF is a multiphase signal. In a setup and hold measuring circuit 100, the generated signals TEST_DATA and TEST_REF are provided to a test device TE. The test device TE receives a data signal TEST_DATA in response to a reference signal TEST_REF. For example, if the phase of the data signal TEST_DATA is shifted by a predetermined delay time in each cycle, a valid value of the data signal TEST_DATA is latched by the test device TE in synchronization with the reference signal TEST_REF. Next, the setup and hold measuring circuit 100 receives a signal outputted from the test device TE, and detects whether the test device TE receives a valid value of the data signal TEST_DATA during an interval of low level/high level of the reference signal TEST_REF. The setup and hold measuring circuit 100 outputs data indicating a setup/hold timing margin of the test device TE through pads PAD0-PADn.

The IC device according to the present invention automatically measures setup and hold timing margins of the IC device and outputs the measured result. Therefore, AC parameters (e.g., a setup timing margin and a hold timing margin) of the IC device may be determined without conventional high-performance automated test equipment that is the setup/hold timing margin may be measured without high-frequency resolution limitations.

Figure 2:
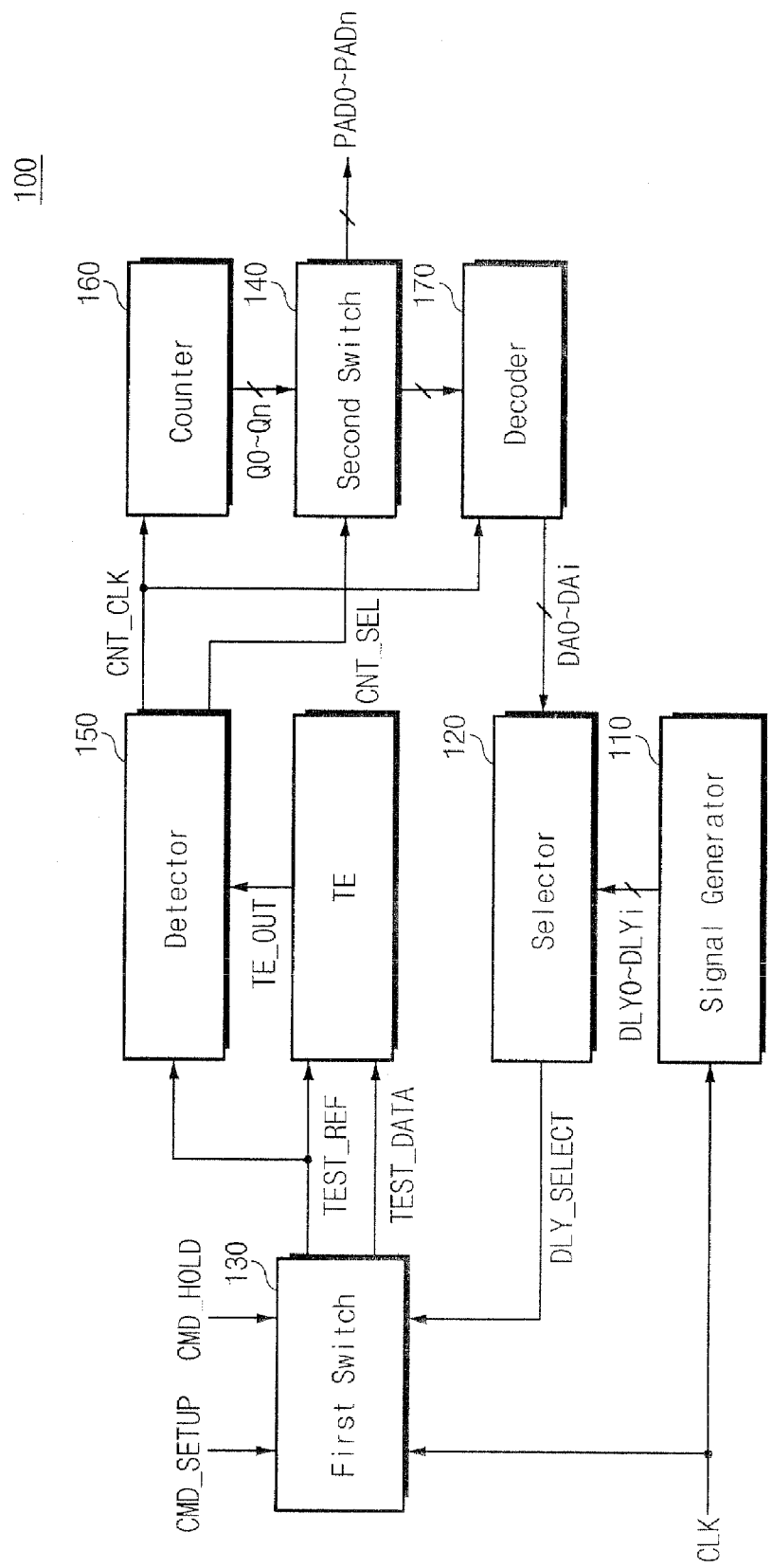
FIG. 2 is a block diagram of a setup and hold measuring circuit in FIG. 1 according to a first embodiment of the present invention.

FIG. 2 is a block diagram of the setup and hold measuring circuit in FIG. 1 according to a first embodiment of the present invention. Referring to FIG. 2, the setup and hold measuring circuit 100 includes a signal generator 110, a selector 120, first and second switches 130 and 140, a detector 150, a counter 160, and a decoder 170.

The signal generator 110 generates a plurality of internal signals DLY0-DLYi in response to the clock signal CLK. For example, the internal signals DLY0-DLYi may be generated by sequentially delaying a clock signal CLK by a predetermined time. That is, the internal signals DLY0-DLYi may have different phases. The selector 120 receives the internal signals DLY0-DLYi generated from the signal generator 110, and selects one of the signals DLY0-DLYi in response to the output signals DA0-DAi of the decoder 170.

The first switch 130 outputs the internal signal DLY_SELECT selected by the selector 120 as a data signal TEST_DATA and the clock signal CLK as a reference signal TEST_REF, respectively, in response to the selection signals CMD_SETUP and CMD_HOLD. For example, the first switch 130 generates the internal signal DLY_SELECT selected by the selector 120 as a data signal TEST_DATA and the clock signal CLK as a reference signal TEST_REF, respectively, in response to an activation of the selection signal CMD_SETUP. Alternatively, the first switch 130 may output the internal signal selected by the selector 120 as a reference signal TEST_REF and the clock signal CLK as a data signal TEST_DATA, respectively, in response to the selection signals CMD_SETUP and CMD_HOLD. The first switch 130 outputs the internal signal DLY_SELECT selected by the selector 120 as a reference signal TEST_REF and the clock signal CLK as a data signal TEST_DATA, respectively, in response to an activation of the selection signal CMD_HOLD. The reference and data signals TEST_REF and TEST_DATA outputted from the first switch 130 are delivered to a test device TE.

In this embodiment, the selection signal CMD_SETUP is activated to measure the setup timing margin, and the selection signal CMD_HOLD is activated to measure a hold timing margin. The signal generator 110 and the selector 120 compose a multiphase signal generator circuit for generating a multiphase signal synchronized with the clock signal CLK.

Continuously, the test device TE receives a data signal TEST_DATA in response to the reference signal TEST_REF. For example, the test device TE receives a data signal TEST_DATA during a low-level interval of the reference signal TEST_REF, and maintains the data signal inputted during a high-level interval of the reference signal TEST_REF. The test device TE is a device practically used in an IC device. Alternatively, the test device TE is designed for testing the setup and hold timing margins. The detector 150 receives an output signal TE_OUT of the test device TE and a reference signal TEST_REF, and detects whether a valid value of the data signal TEST_DATA is latched by the test device TE in synchronization with the reference signal TEST_REF. That is, when the selection signal CMD_SETUP is activated, the detector 150 detects whether the data signal TEST_DATA is latched within a predetermined setup timing margin. Similarly, when the selection signal CMD_HOLD is activated, the detector 150 detects whether the latched data signal TEST_DATA is maintained during a predetermined hold timing margin.

The detector 150 generates control signals CNT_CLK and CNT_SEL for controlling a second switch 140, a counter 160 and a decoder 170 according to a detected result. For example, when the valid value of the data signal TEST_DATA is latched by the test device TE in synchronization with the reference signal TEST_REF, the detector 150 generates a reference signal TEST_REF as a control signal CNT_CLK and a control signal CNT_SEL of low level. When a valid value of the data signal TEST_DATA is not latched by the test device TE in synchronization with the reference signal TEST_REF, the detector 150 may output a control signal CNT_CLK of low level and a reference signal TEST_REF as a control signal CNT_SEL.

The counter 160 performs a count operation with an N-bit counter in response to a control signal CNT_CLK generated from the detector 150. For example, the counter 160 performs a count operation when the control signal CNT_CLK is toggled in synchronization with the reference signal TEST_REF. A second switch 140 receives outputs Q0-Qn from the counter 160 and delivers signals to pads PAD0-PADn or a decoder 170 in response to control signal CNT_SEL from the detector 150. For example, when the control signal CNT_SEL indicates that a valid value of the data signal TEST_DATA is latched by the test device TE in synchronization with the reference signal TEST_REF (i.e., the control signal CNT_SEL is at to a low level), the second switch 140 delivers counter 160 outputs Q0-Qn to the decoder 170. When the control signal CNT_SEL indicates that the valid value of the data signal TEST_DATA is not latched by the test device TE in synchronization with the reference signal TEST_REF (i.e., the control signal CNT_SEL is toggled in synchronization with the reference signal TEST_REF), a second switch 140 delivers counter 160 outputs Q0-Qn to the pads PAD0-PADn. The outputted value through the pads PAD0-PADn indicates a setup/hold timing margin of the test device TE. The decoder 170 decodes the count value delivered through the second switch 140 in response to the control signal CNT_CLK toggled in synchronization with the reference signal TEST_REF, and generates the decoded signals DA0-DAi to the selector 120.

In this embodiment, the second switch 140, the counter 160 and the decoder 170 compose a selection signal generator circuit for generating selection signals for selecting internal signal DLY0-DLY7.

According to the IC device of the present invention, a reference signal TEST_REF and a data signal TEST_DATA that measure a setup/hold timing margin automatically are generated internally using only the external clock signal CLK, such that the setup and hold margins can be measured without a limitation of high-frequency resolution (i.e., without a high-performance tester).

Figure 3:
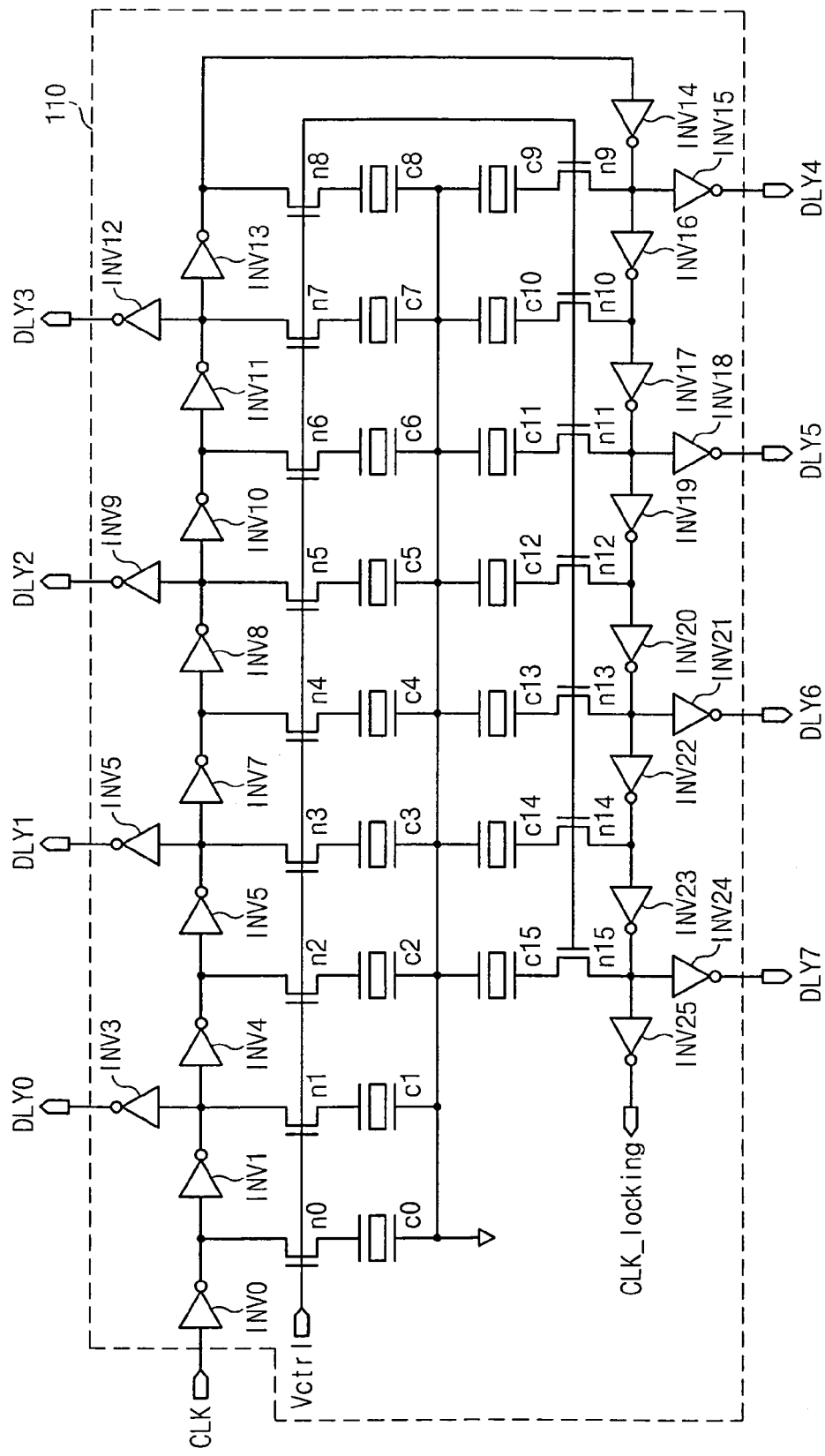
FIG. 3 is a circuit diagram of a signal generator in FIG. 2 according to the present invention.

FIG. 3 is a circuit diagram of a signal generator in FIG. 2 according to the present invention.

Referring to FIG. 3, the signal generator 110 of the present invention comprises a delay locked loop (DLL) for generating delay signals DLY0-DLY7 in synchronization with a clock signal CLK. The delay signals DLY0-DLY7 may be delivered to the selector 120 in FIG. 2 as internal signals. It is clear to those skilled in the art that the signal generator 110 of the present invention is not limited to a DLL circuit. The DLL circuit used as the signal generator 110 may be practically used in an IC device. Alternatively, the DLL circuit used as a multiphase signal generator 110 may be designed to test the setup/hold timing margin. The delay clock signal DLY0-DLY7 has a phase converted with that of the clock signal CLK, and overlaps the clock signal CLK by a delay time of each unit (each delay unit may be comprised of a couple of inverters). The DLL circuit is maintained to a locked state when the setup/hold timing margin is determined. The number of delay signals DLY0-DLY7 may be controlled according to the frequency of operation and the resolution.

Figure 4:
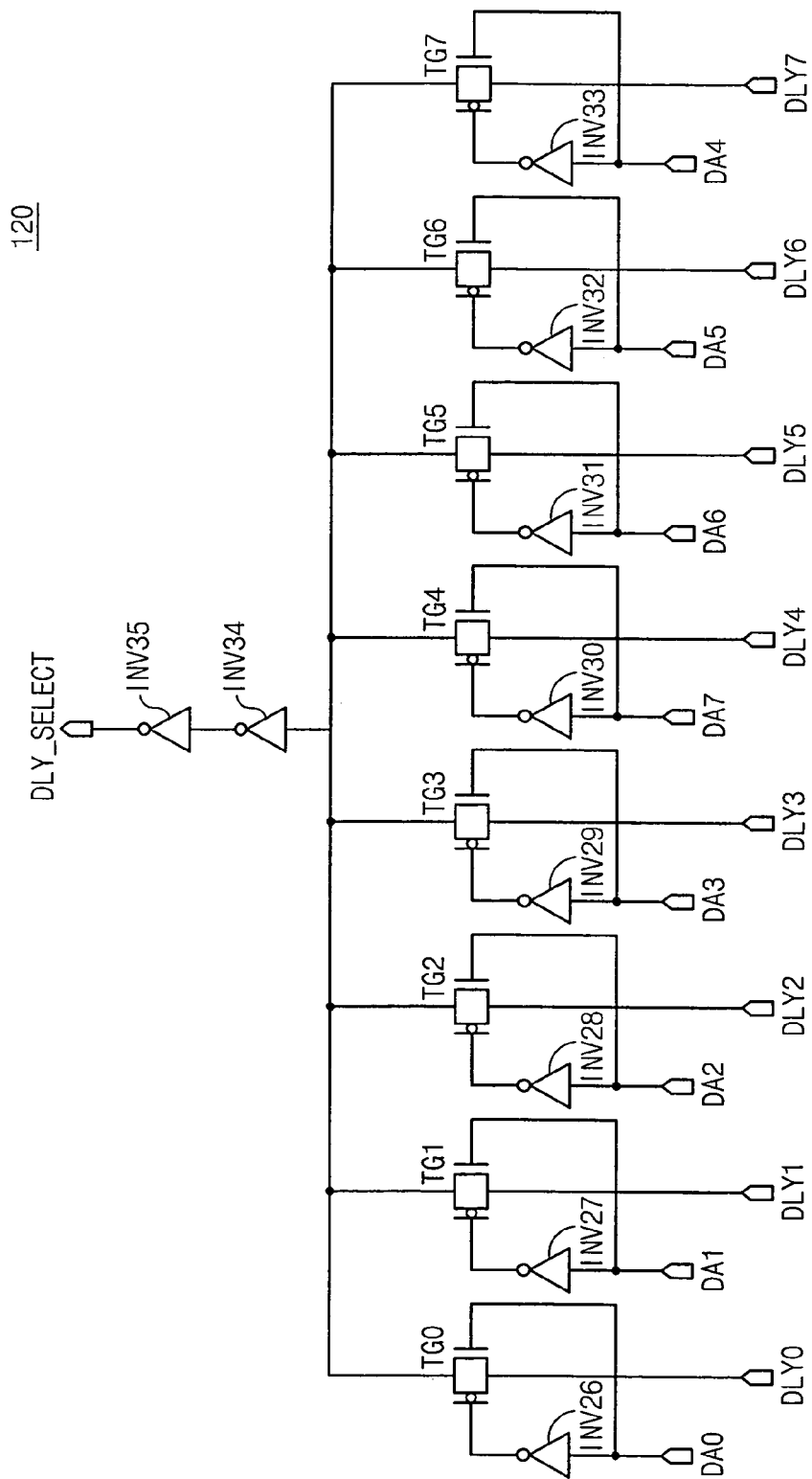
FIG. 4 is a circuit diagram of a selector in FIG. 2 according to an embodiment of the present invention.

FIG. 4 is a circuit diagram of a selector in FIG. 2 according to an embodiment of the present invention.

Referring to FIG. 4, the selector 120 of the present invention includes transfer gates TG0-TG7 corresponding to each of the output signals DA0-DA7 and a plurality of inverters INV26-INV35, being connected as in the drawings. The transfer gates TG0-TG7 are activated by the corresponding signals DA0-DA7, respectively. The selector 120 selects one of the output signals DLY0-DLY7 from the signal generator 110 in response to output signals DA0-DA7 of the decoder 170. The output signals DA0-DA7 of the decoder 170 are sequentially activated, such that internal signals DLY0-DLY7 will be sequentially outputted. Therefore, output signal DLY_SELECT of the selector 120 becomes a multiphase signal having a phase delayed by a predetermined time in each clock cycle.

Figure 5:
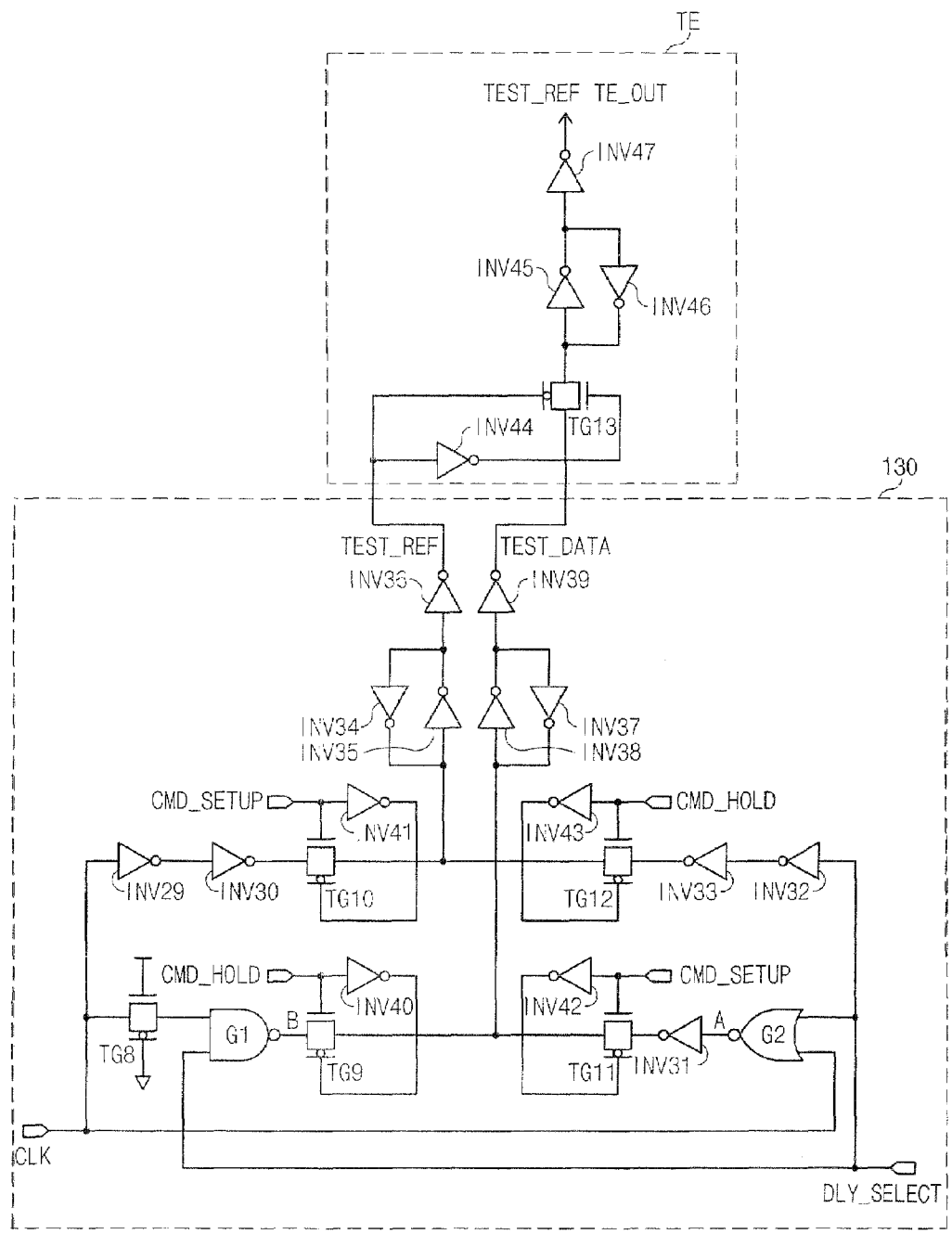
FIG. 5 is a circuit diagram of a first switch and a test device in FIG. 2 according to the present invention.
Figure 6:
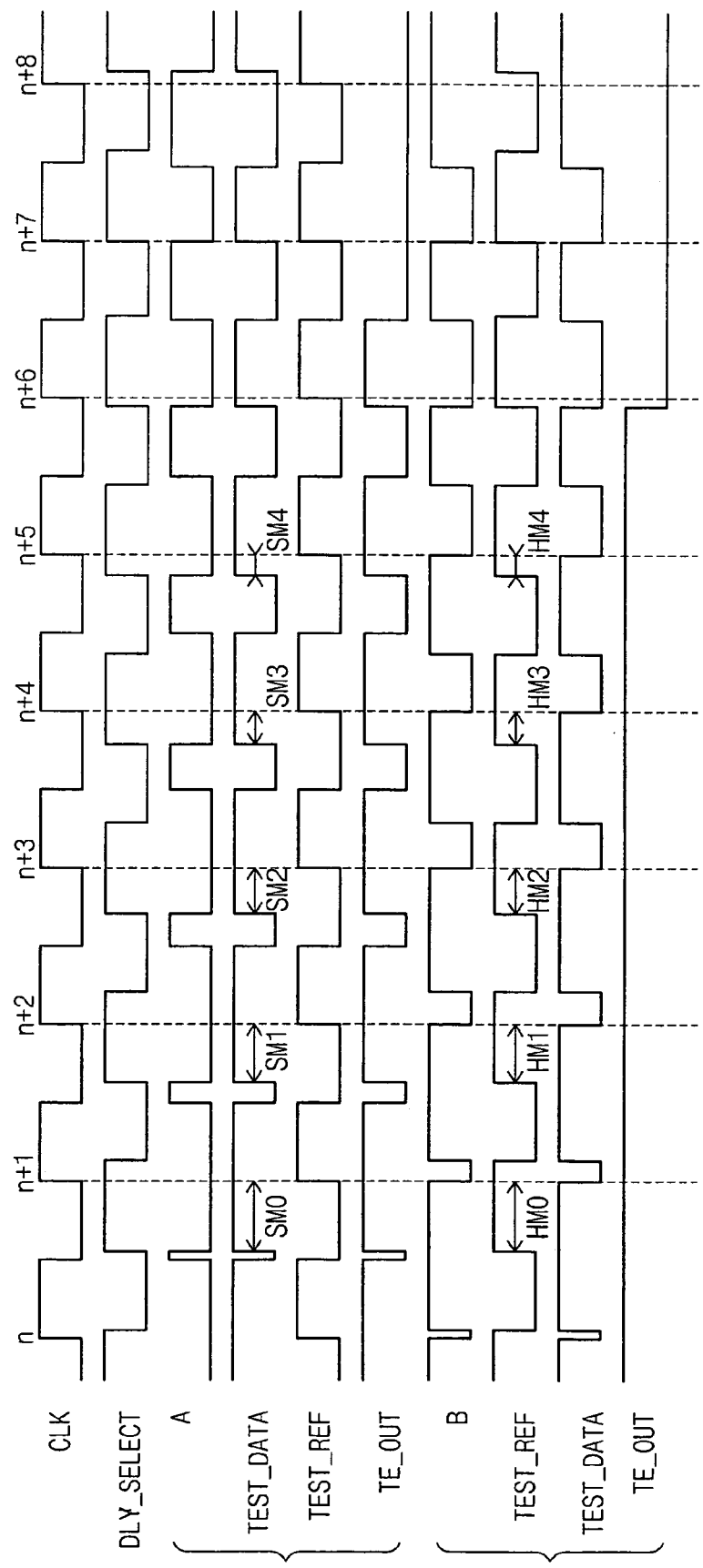
FIG. 6 is a timing diagram illustrating an operation of a first switch in FIG. 5.

FIG. 5 is a circuit diagram of first switch 130 and test device TE in FIG. 2 according to an embodiment of the present invention. FIG. 6 is a timing diagram illustrating an operation of the first switch 130 in FIG. 5. First, referring to FIG. 5, the first switch 130 includes a NAND gate G1, a NOR gate G2, transfer gates TG8-TG12 and inverters INV29-INV43, as connected in the figure. The first switch 130 receives a clock signal CLK and an output signal DLY_SELECT of the selector 120, and generates a reference signal TEST_REF and a data signal TEST_DATA in response to selection signals CMD_SETUP and CMD_HOLD as will be fully explained below. The test device TE according to the present invention includes a transfer gate TG13 and inverters INV44 and INV47, being connected as in the drawings. The test device TE receives a data signal TEST_DATA during an interval of low level of the reference signal TEST_REF and maintains the data signal inputted during an interval of high level of the reference signal TEST_REF.

Before an operation of the first switch 130 is explained, assume that the selection signal CMD_SETUP is activated to high and the selection signal CMD_HOLD is set low. According to this assumption, the transfer gates TG10 and TG11 are conducted and the transfer gates TG9 and TG12 are not conducted. This means that the clock signal CLK is generated as a reference signal TEST_REF and an output A of the NOR gate G2 is generated as a data signal TEST_DATA. The reference signal TEST_REF has the same phase as the clock signal CLK. A clock signal CLK and a selected internal signal DLY_SELECT are applied to the NOR gate G2, thereby being generated a pulse signal A illustrated in FIG. 6. That is, the output A of the NOR gate G2 has a high level when all the input signals are in a low level. A width of the pulse signal A becomes wider by a predetermined time in each clock cycle. Then, the test device TE receives a data signal TEST_DATA during a low-level interval of the reference signal TEST_REF and the test device is inactivated during a high-level interval of the reference signal TEST_REF. Therefore, a signal TE_OUT having the same phase as the data signal TEST_DATA is generated.

In an (n+7)th cycle, when the reference signal TEST_REF transitions from the low level to the high level as illustrated in FIG. 6, the output signal TE_OUT of the test device TE is maintained to a low level, continuously. This is because the data signal TEST_DATA is maintained to a low level in the (n+7)th cycle. This means that the test device TE does not latch a valid value (a high-level value of the data signal) of the data signal TEST_DATA in the (n+7)th cycle.

Then, assume that the selection signal CMI_SETUP is inactivated low and the selection signal CMD_HOLD is activated high. According to this assumption, the transfer gates TG10 and TG11 are not conducted and the transfer gates TG9 and TG12 are conducted. This means that the selected internal signal DLY_SELECT is generated as a reference signal TEST_REF and the output B of the NAND gate G1 is outputted as the data signal TEST_DATA. The reference signal TEST_REF has the same waveform as the selected internal signal DLY_SELECT. The clock signal CLK and the selected internal signal DLY_SELECT are applied to the NAND gate G1, and a pulse signal B is generated as illustrated in FIG. 6 as a result. That is, the output B of the NAND gate G1 has a low level when all the input signals are in a high level. A pulse width of the pulse signal B becomes wider by a predetermined time in each clock cycle. Then the test device TE receives a data signal TEST_DATA during a low-level interval of the reference signal TEST_REF, and is activated during a high-level interval of the reference signal TEST_REF, such that the output signal TE_OUT of the test device TE is maintained to high.

As illustrated in FIG. 6, when a reference signal TEST_REF transitions from a low level to a high level in the (n+5)th cycle, the output signal TE_OUT of the test device TE transitions from a high level to a low level. This is because the data signal TEST_DATA transitions to a low level in the (n+5)th cycle. That is, this means that the test device TE does not maintain a valid value of the data signal TEST_DATA.

Figure 7:
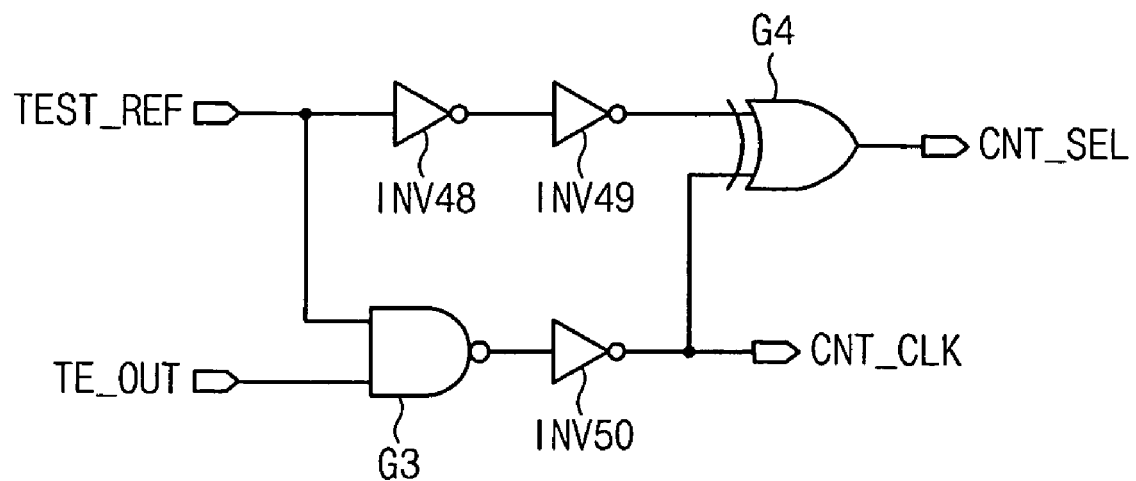
FIG. 7 is a circuit diagram of a detector in FIG. 2 according to an embodiment of the present invention.
Figure 8:
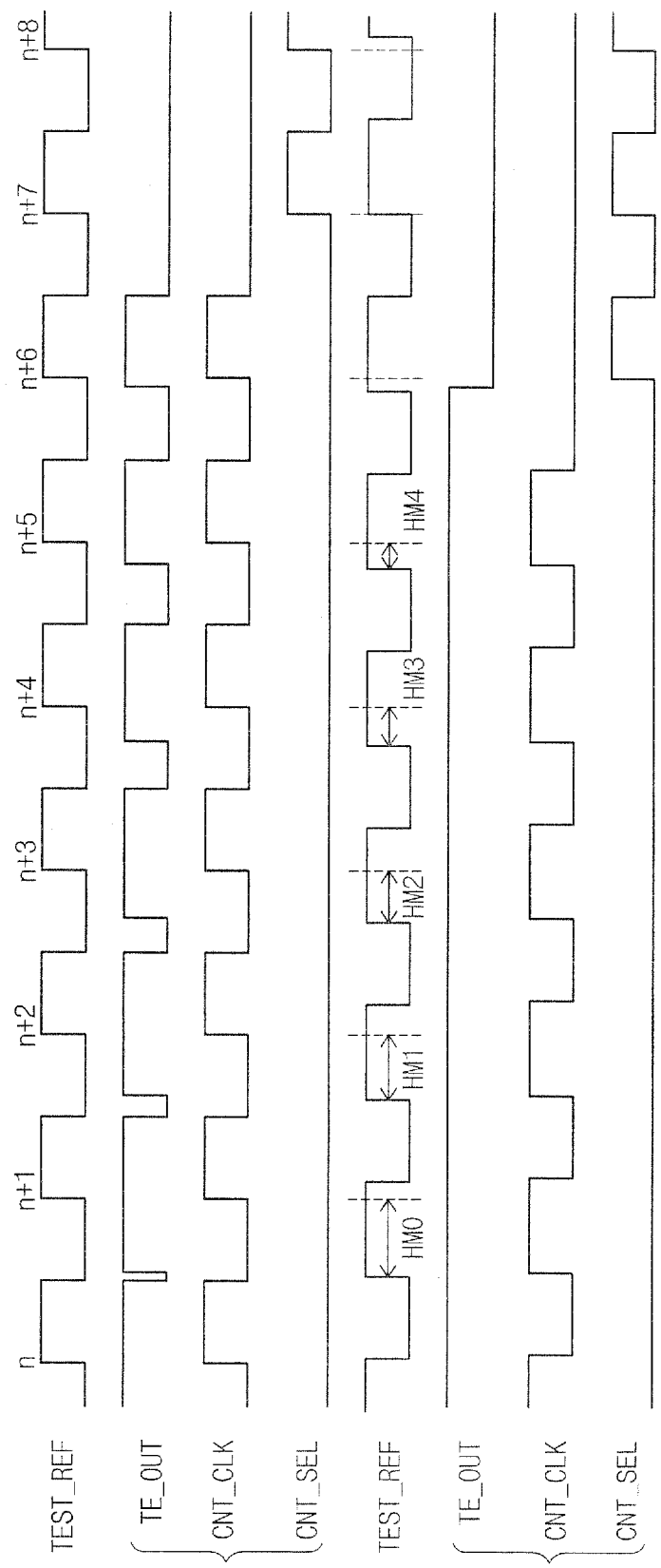
FIG. 8 is a timing diagram illustrating an operation of a detector in FIG. 7.

FIG. 7 is a circuit diagram of the detector in FIG. 2 according to an embodiment of the present invention. FIG. 8 is a timing diagram illustrating an operation of the detector in FIG. 7. Referring to FIG. 7, the detector 150 according to the present invention includes inverters INV48, INV49 and INV 50, a NAND gate G3 and a XOR gate G4, being illustrated in the drawings. The detector 150 generates control signals CNT_SEL and CNT_CLK in response to an output signal TE_OUT of the test device TE and a reference signal TEST_REF from the switch 130, as will be explained in further detail below.

If the selection signal CMD_SETUP is activated, the reference signal TEST_REF has the same waveform as the clock signal CLK, and the output signal TE_OUT of the test device TE has a pulse waveform of which width gradually increases as illustrated in FIG. 6. The NAND gate G3 receives an output signal TE_OUT of the test device TE to generate a converted signal of the reference signal TEST_REF, such that the control signal CNT_CLK has the same waveform as the reference signal TEST_REF. In this case, the reference signal TEST_REF via the inverters INV43 and INV44 and the reference signal TEST_REF via the NAND gate G3 and the inverter INV45 are applied to an XOR gate G4, such that an output CNT_SEL of the XOR gate G4 is set low. According to the above explanation, in a cycle of (n+7)th (or after the cycle of (n+7)th), a valid value of the test device TE does not latch a valid value, such that an output signal TE_OUT of the test device TE is maintained to a low level in the (n+7)th cycle. As the output signal TE_OUT is maintained to a low level, the control signal CNT_CLK is maintained to a low level but the control signal CNT_SEL is toggled in synchronization with the reference signal TEST_REF.

If the selection signal CMD_HOLD is activated, similar to above, the test device TE does not maintain a valid value in (n+5)th cycle, such that the output signal TE_OUT of the test device TE is maintained to a low level as illustrated in FIG. 8. As the output signal TE_OUT is maintained to a low level, the control signal CNT_CLK is maintained to a low level but the control signal CNT_SEL is toggled in synchronization with the reference signal TEST_REF.

Figure 9:
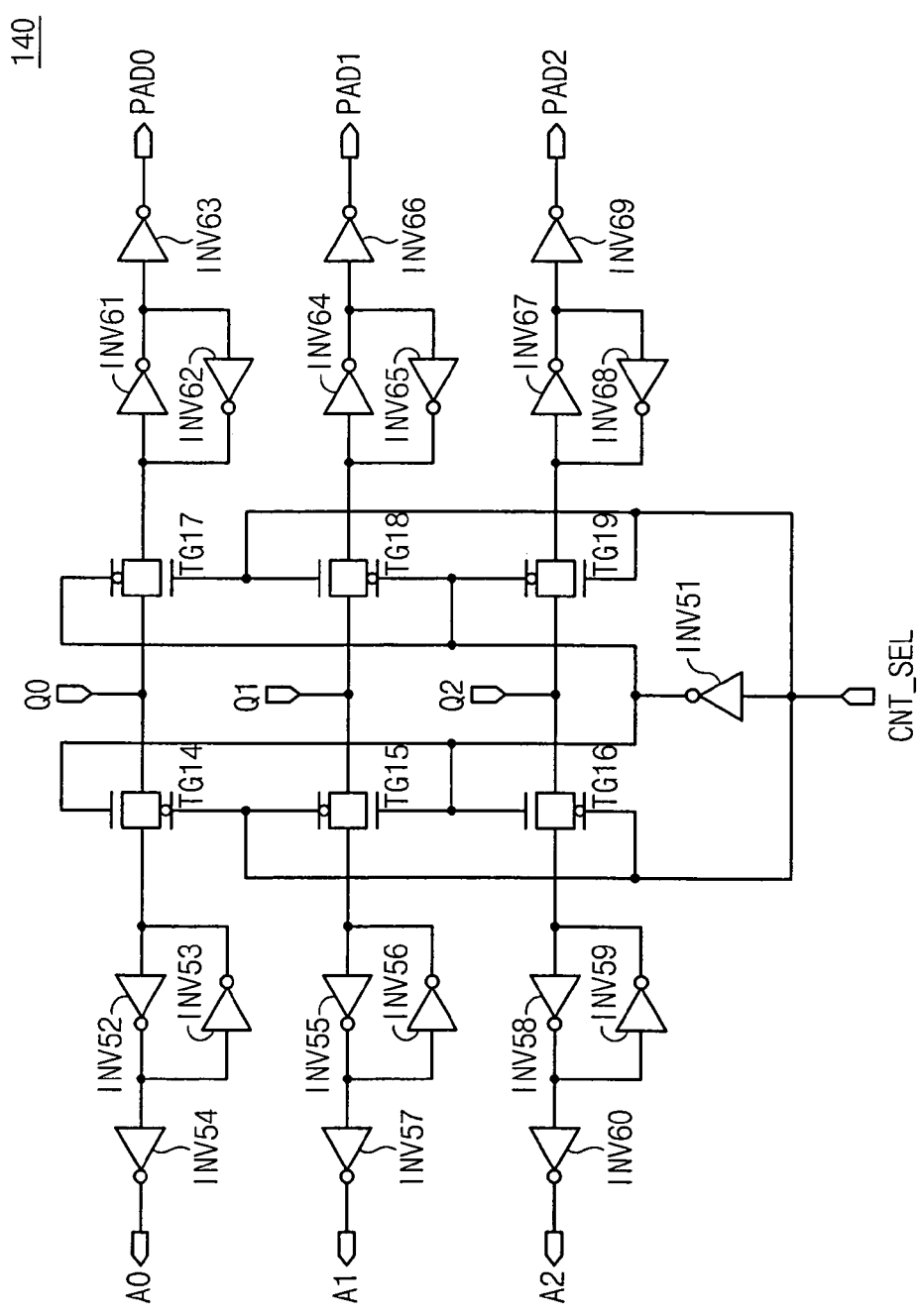
FIG. 9 is a circuit diagram of a second switch in FIG. 2 according to an embodiment of the present invention.

FIG. 9 is a circuit diagram of the second switch illustrated in FIG. 2 according to the present invention. Referring to FIG. 9, a second switch 140 includes inverters INV51-INV69 and the transfer gates TG14-TG19, as illustrated. The second switch 140 outputs the output signals Q0-Q2 of the counter 160 as input signals A0-A2 of the decoder 170 when the control signal CNT_SEL is low. The second switch 140 generates output signals Q0-Q2 of the counter 160 to pads PAD0-PAD2 when the control signal CNT_SEL is high.

Hereinafter, an operation of the setup and hold measuring circuit according to the first embodiment of the present invention will be explained in reference to the drawings.

As mentioned above, the selection signal CMD_SETUP may be activated and the selection signal CMD_HOLD inactivated to measure a setup timing margin. If a clock signal CLK is applied to setup and hold measuring circuit 100, the signal generator 110 generates internal signals DLY0-DLY7 in response to the clock signal CLK. Assume that a control signal CNT_SEL is maintained to a low level in an nth cycle of the clock signal CLK, and the counter 160 is initialized to generate a count value of "000" in a test mode of operation. According to the assumption, the outputs Q0-Qn of the counter 160 are delivered to the decoder 170 through the second switch 140. The decoder 170 decodes outputs Q0-Qn of the counter 160 to output the decoding signals DA0-DA7. In this case, the decoding signal DA0 is activated. The selector 120 selects a first internal signal DLY0 from the signals DLY0-DLY7 generated from the signal generator 110 in response to the activated decoding signal DA0. The selected signal DLY_SELECT is delivered to a first switch 130. The selection signal CMID_SETUP is activated to high, such that the first switch 130 generates the clock signal CLK as a reference signal TEST_REF, and the signal DLY_SELECT selected by the selector 120 as a data signal TEST_DATA.

Since the test device TE receives a data signal TEST_DATA during a low level of the reference signal TEST_REF of the nth cycle, an output signal TE_OUT of the test device TE has the same waveform as the data signal TEST_DATA as illustrated in FIG. 6. The test device TE is inactivated and maintains the latched value when the reference signal TEST_REF transitions from a low level to the high level. In this case, the detector 150 generates the control signals CNT_SEL and CNT_CLK in response to the signal TE_OUT outputted from the test device and the reference signal TEST_REF.

In the nth cycle, the reference signal TEST_REF has the same waveform as the clock signal CLK and the output signal TE_OUT of the test device TE has the same waveform as the data signal TEST-DATA, such that the NAND gate G3 of the detector 150 generates a converted signal of the reference signal TEST_REF. Therefore, the control signal CNT_CLK is toggled in synchronization with the reference signal TEST_REF. In this case, because the reference signal TEST_REF via inverters INV43 and INV 44 and the reference signal TEST_REF via the NAND gate G3 and the inverter INV45 are applied to the XOR gate G4 as illustrated in FIG. 7, outputs CNT SEL of the XOR gate G4 is maintained to a low level as illustrated in FIG. 8. The counter 160 performs a count operation in synchronization with the control signal CNT_CLK in the (n+1)th cycle. The second switch 140 delivers outputs Q0-Qn of the counter 160 to the decoder 170 in response to the control signal CNT_SEL of the low level. That is, the internal signal DLY1 is selected by the selector 120 because the count value increases by '1'.

As the above operation repeats, a setup timing margin between the reference signal TEST_REF and the data signal TEST_DATA decreases gradually as illustrated in FIG. 6 (SM0>SM1>SM2>SM3 . . . ). As the timing margin decreases, the data signal TEST_DATA is maintained to a low level while the reference signal TEST_REF is maintained to a low level in the (n+6)th cycle as illustrated in FIG. 6. That is, the output signal TE_OUT of the test device TE is maintained to a low level when the reference signal TEST_REF transitions from a low level to a high level in the (n+7)th cycle to make the test device TE inactivated. This sets control signal CNT_CLK to low and the control signal CNT-SEL toggles in synchronization with the reference signal TEST_REF. Therefore, as the control signal CNT_CLK is maintained low, the counter 160 and the decoder 170 do not operate. The second switch 140 delivers output values of the counter 160 to the pads PAD0-PAD2 in response to a control signal CNT_SEL. The values delivered to the pads PAD0-PAD2 indicate binary code data when the test device TE latches abnormal data (i.e., an invalid value of data signal).

To determine a hold timing margin, a selection signal CMD_SETUP may be inactivated and a selection signal CMD_HOLD activated. As illustrated above, if the clock signal CLK is applied to a setup and hold measuring circuit 100, a signal generator 110 generates internal signals DLY0-DLY7 in response to a clock signal CLK. Assume that the control signal CNT_SEL is maintained low in an nth cycle of the clock signal CLK and the counter 160 is initialized in a test mode to generate a count value of "000". According to this assumption, the output of the counter 160 is delivered to the decoder 170 through a second switch 140. The decoder 170 decodes an output of the counter 160 to generate decoding signals DA0-DA7. In this case, the decoding signal DA0 is activated. The selector 120 selects a first internal signal DLY0 of the signals DLY0-DLY7 generated from the signal generator 110 in response to the decoding signal DA0. The selected signal DLY_SELECT is delivered to a first signal 130. The selected signal CMD_HOLD is activated to high, such that the first switch 130 generates the signal DLY_SELECT selected by the selector 120 as a reference signal TEST_REF, and an output signal B of the NAND gate G1 receiving the clock signal CLK and the selected signal DLY_SELECT as the data signal TEST_DATA.

Since the test device TE receives the data signal TEST_DATA during a low level of the reference signal TEST_REF in the nth cycle of the test device TE, the output signal TE_OUT of the test device TE is maintained high as illustrated in FIG. 6. The test device TE is inactivated and maintains the latched value when the reference signal TEST-REF transitions from a low level to a high level. In this case, the detector 150 generates control signals CNT_SEL and CNT_CLK in response to an output signal TE_OUT from the test device TE and the reference signal TEST_REF. In the nth cycle, the reference signal TEST_REF has the same waveform as the multiphase signal DLY_SELECT and an output signal TE_OUT of the test device TE is maintained to a high level, such that the NAND gate G3 in FIG. 7 generates a converted signal of the reference signal TEST_REF. Therefore, the control signal CNT_CLK is toggled in synchronization with the reference signal TEST_REF. As illustrated in FIG. 7, the reference signal TEST_REF via the inverters INV43 and INV44 and the reference signal TEST_REF via the NAND gate G3 and the inverter INV45 are applied to an XOR gate G4, such that an output CNT_SEL of the XOR gate G4 is maintained to a low level. The counter 160 performs a count operation in an (n+1)th cycle in synchronization with a control signal CNT_CLK. The second switch 140 delivers an output of the counter 160 to the decoder 170 in response to a control signal CNT_SEL of low level. That is, as a count value increases by '1', such that an internal signal DLY1 is selected by the selector 120.

As the above operations repeat, a hold timing margin between the reference signal TEST_REF and the data signal TEST_DATA decreases gradually (HM0>HM1>HM2 . . . ) as illustrated in FIG. 6. According to the decrease of the hold timing margin, when the reference signal TEST_REF transitions from a low level to a high level to inactivate the test device TE in a (n+6)th cycle, the test device TE does not have an valid value (a high-level value) of the data signal TEST_DATA. Therefore, the output signal TE_OUT of the test device TE transitions from a high level to a low level. This sets control signal CNT_CLK to a low level, and the control signal CNT_SEL toggles in synchronization with the reference signal. Therefore, the counter 160 and the decoder 170 do not operate as the control signal CNT_CLK is low. The second switch 140 delivers output values of the counter 160 to the pads PAD0-PAD2 in response to a control signal CNT_SEL. The values delivered to the pads PAD0-PAD2 indicate binary code data when the test device TE latches abnormal data (or an invalid value of the data signal).

Figure 10A:
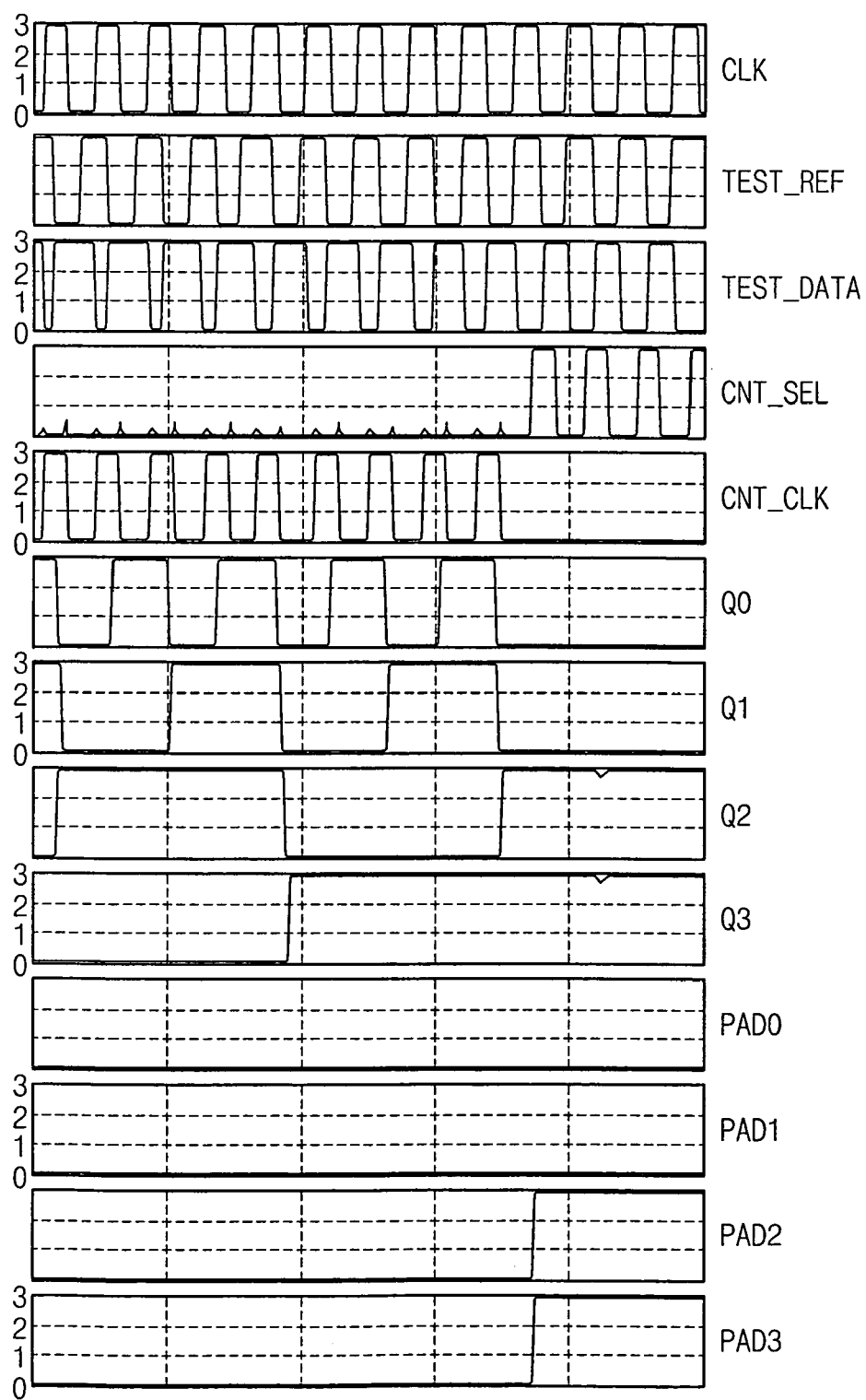
FIGS. 10A and 10B are graphs illustrating results of trial test on the setup and hold measuring circuit according to the present invention.
Figure 10B:
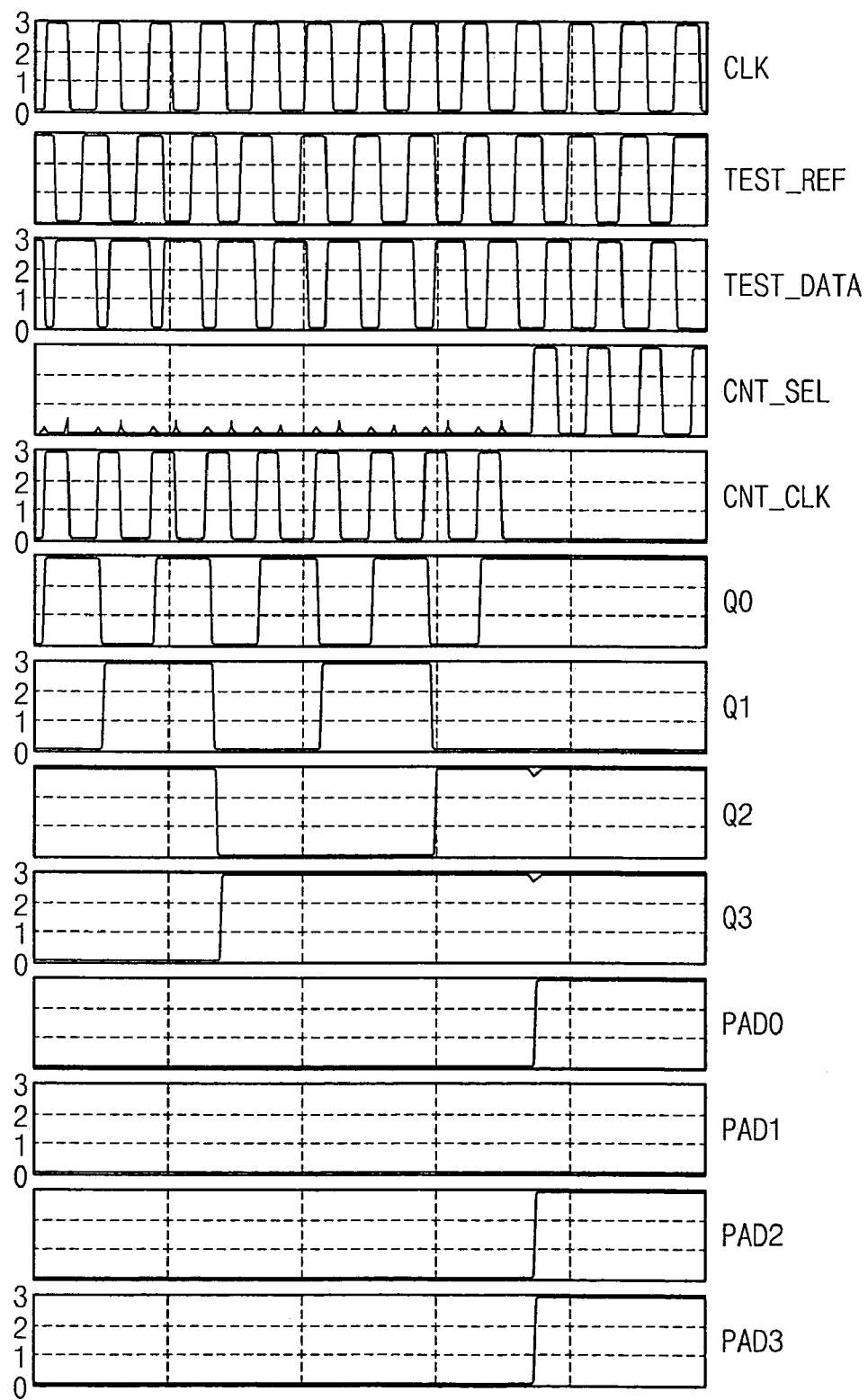

FIGS. 10A and 10B illustrate a result of trial experiment with respect to a setup and hold measuring circuit according to the present invention. The result of the trial experiment in FIGS. 10A and 10B is achieved by a clock signal CLK of 250 MHz and a power supply voltage of 3.3V, and 4-bit binary code was used considering a setup and hold timing margin. Referring to FIG. 10A illustrating a waveform achieved when the setup timing margin is measured, as the binary code value increases by 1 bit, a setup timing margin between the reference signal TEST_REF and the data signal TEST_DATA as an input signal of the test device gradually decreases. As the setup timing margin is reduced, the test device TE does not latch a valid value of the data signal TEST_DATA, such that control signal CNT_CLK maintains a low level, and the latched binary code value is generated through the pads while the control signal CNT_SEL is toggled. The value outputted through the pads is "1100" and the test device TE does not latch a valid value of the data signal TEST_DATA. Therefore, the practical setup timing margin becomes "1011" and is smaller than the binary code transferred to the pads by one bit. As known from FIG. 10B illustrating a waveform achieved during a measurement of the hold timing margin, the hold timing margin will be measured in the same way.

Figure 11:
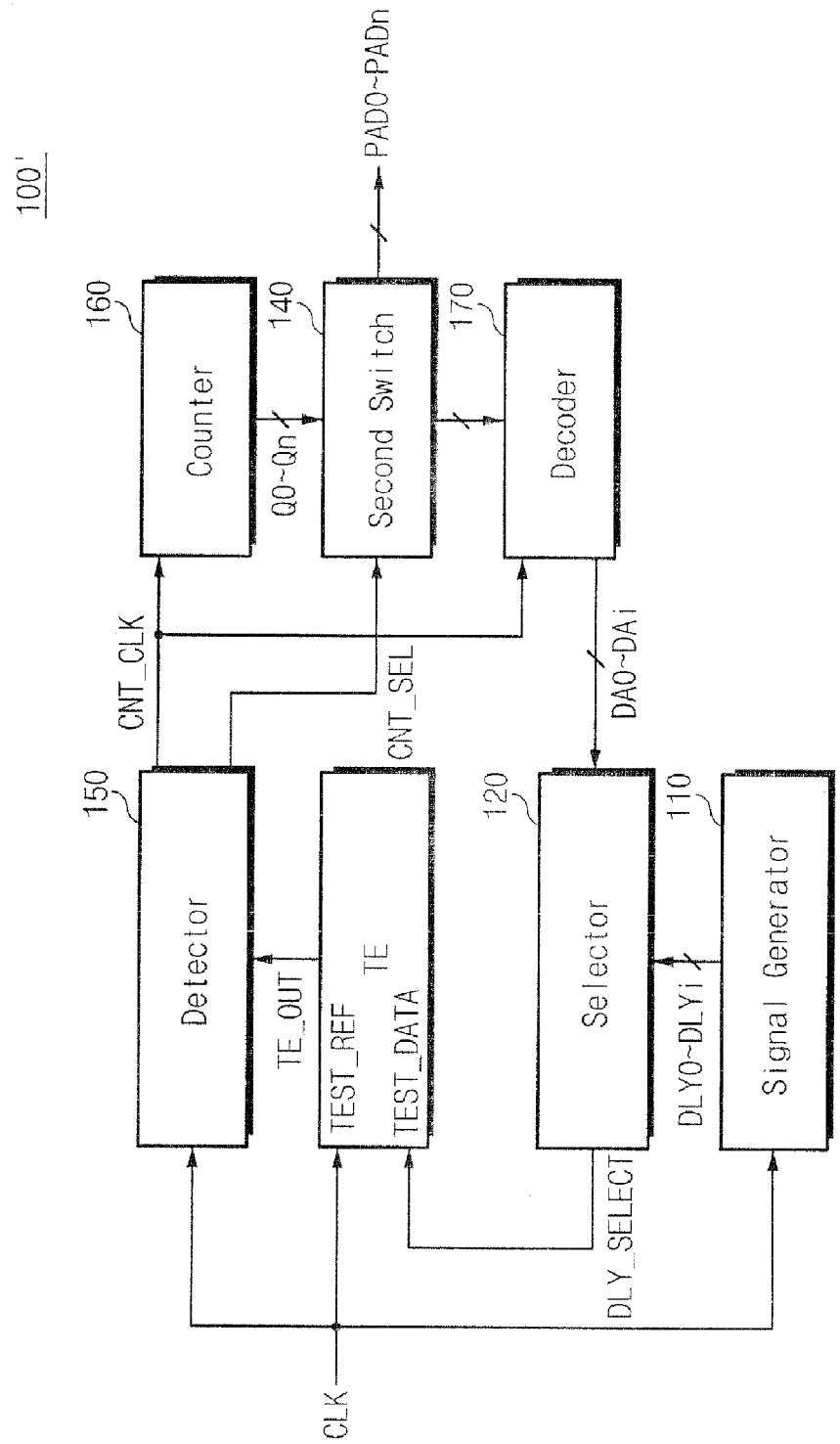
FIG. 11 is a block diagram of a setup and hold measuring circuit according to a second embodiment of the present invention.

FIG. 11 is a block diagram illustrating a setup and hold measuring circuit according to a second embodiment of the present invention. The setup and hold measuring circuit 100' according to the second embodiment is for measuring a setup timing margin and is practically the same as what is illustrated in FIG. 2 except for the first switch. Thus, component elements in FIG. 11 having the same function as those in FIG. 2 are marked with the same reference numbers as in FIG. 2. Since the first switch 130 is removed, the clock signal CLK is fixed to a reference signal TEST_REF of the test device TE, and the selected internal signal DLY_SELECT may be fixed to a data signal TEST_DATA of the test device TE. Except for this, the setup and hold measuring circuit 100' in FIG. 11 operates practically in the same way as in FIG. 2, and will not be further explained.

Figure 12:
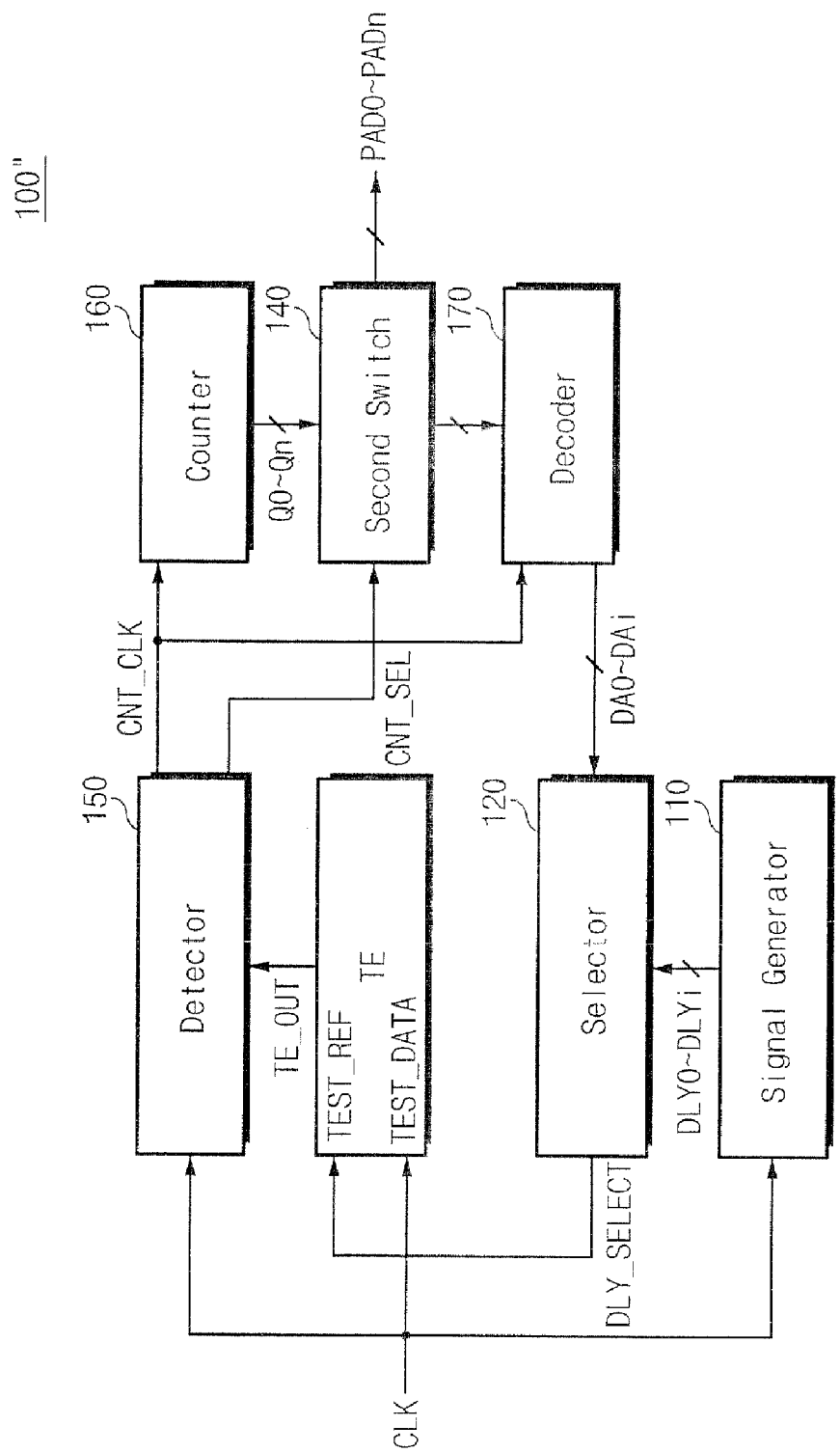
FIG. 12 is a block diagram of a setup and hold measuring circuit according to a third embodiment of the present invention.

FIG. 12 is a block diagram illustrating a setup and hold measuring circuit according to a third embodiment of the present invention. The setup and hold measuring circuit 100" according to the third embodiment is for measuring a hold timing margin and practically the same as what is illustrated in FIG. 2 except the first switch in FIG. 2 is removed. Therefore, the component elements in FIG. 12 having identical functions to those in FIG. 2 will be marked with the same reference numbers as in FIG. 2. As the first switch 130 is removed, the clock signal CLK may be fixed to a data signal TEST_DATA of the test device TE and the selected internal signal DLY_SELECT to a reference signal TEST_REF of the test device TE. Except for this, the setup and hold measuring circuit 100" in FIG. 12 operates practically the same as illustrated in FIG. 2 and will not be further explained.

According to the above explanation, setup/hold timing margins of the IC device are automatically measured with respect to an external clock signal CLK. The measured result is generated as a setup/hold timing margin, such that the setup and hold timing margin of the IC device can be measured without a high-performance automated test equipment.

A person skilled in the art will be able to practice the present invention in view of the description present in this document, to be taken as a whole. Numerous details have been set forth in order to provide a more thorough understanding of the invention. In other instances, well-known features have not been described in detail in order not to obscure the invention.

While the invention has been disclosed in its preferred embodiments, the specific embodiments as disclosed and illustrated herein are not to be considered limiting. Indeed, it should be readily apparent to those skilled in the art in view of the present description that the invention may be modified in numerous ways. The inventor regards the subject matter of the invention to include all combinations and sub-combinations of the various elements, features, functions and/or properties disclosed herein.

The following claims define certain combinations and sub-combinations, which are regarded as novel and non-obvious. Additional claims for other combinations and sub-combinations of features, functions, elements and/or properties may be presented in this or a related document.

We claim:

1. A circuit comprising:
   a test device to receive a data signal in response to a reference signal and to output the data signal; and
   a setup/hold measuring circuit to generate the reference signal and the data signal in response to a clock signal, comprising:
   a circuit to output the clock signal as the reference signal and a multiphase signal as the data signal, in response to a setup enable signal;
   a circuit to output the clock signal as the reference signal and a multiphase signal as the data signal, in response to a hold enable signal;
   a circuit to detect whether an output of the test device indicates a valid value of the data signal; and
   a circuit to activate selection signals sequentially according to a result of the detection circuit.

2. The circuit of claim 1 comprising at least one pad coupled with the setup/hold measuring circuit, to output a setup/hold timing margin.

3. The circuit of claim 2, wherein the setup/hold timing margin is transferred to the at least one pad when the output of the test device indicates an invalid value of the data signal, the invalid value being a low-level value when the reference signal transitions from the low-level to a high-level value.

4. The circuit of claim 3, wherein the setup/hold measuring circuit includes means for ending the detect operation when the output of the test device indicates the invalid value of the data signal.

5. The circuit of claim 1, wherein one of the reference signal and the data signal is a multiphase signal synchronized with the clock signal.

6. The circuit of claim 1, comprising a delay locked loop to generate the reference signal and the data signal.

7. The circuit of claim 6, wherein the delay locked loop is configured to maintain to a locked state during operation of the setup/hold measuring circuit.

8. The circuit of claim 1, wherein the setup/hold measuring circuit further comprises:
   a counting circuit to perform a count operation in response to a first control signal, wherein the circuit outputs a count value and, wherein the first control signal depends on whether the output of the test device indicates a valid value of the data signal;
   a circuit to decode the output of the counting circuit to generate the selection signals in response to the first control signal; and
   a circuit to transfer the output of the counting circuit in response to a second control signal, wherein the second control signal depends on whether the output of the test device indicates a valid value of the data signal.

9. A circuit comprising:
   a test device to receive a data signal in response to a reference signal and to output the data signal; and
   a setup/hold measuring circuit to generate the reference signal and the data signal in response to an external clock signal, comprising:
      a first switch circuit to output the external clock signal as the reference signal and a multiphase signal as the data signal, in response to a setup/hold enable signal;
      a detection circuit to detect whether an output of the test device indicates a valid value of the data signal; and
      a selection signal generator circuit to activate selection signals sequentially according to a result of the detection circuit.

10. The circuit of claim 9 wherein the valid value is a high-level value when the reference signal transitions from a low-level value to the high-level value.

11. The circuit of claim 10 comprising at least one pad coupled with the setup/hold measuring circuit, to output a setup/hold timing margin.

12. The circuit of claim 11, wherein the setup/hold timing margin is transferred to the at least one pad when the output of the test device indicates an invalid value of the data signal, the invalid value being the low-level value when the reference signal transitions from the low-level to the high-level value.

13. The circuit of claim 12, wherein the setup/hold measuring circuit includes means for ending the detect operation when the output of the test device indicates the invalid value of the data signal.

14. The circuit of claim 13, wherein the detection circuit generates first and second control signals depending on whether the output of the test device indicates the valid value of the data signal.

15. The circuit of claim 14, wherein the setup/hold measuring circuit further comprises:
   a counter circuit to perform a count operation in response to the first control signal;
   a decoder circuit to decode an output of the counter to generate the selection signal, in response to the first control signal; and
   a second switch circuit to transfer the counter output in response to the second control signal.

16. The circuit of claim 15, wherein the counter circuit outputs the counter output as the setup/hold timing margin when the second control signal is toggled in synchronization with the reference signal.

17. The circuit of claim 16, wherein when the first control signal is toggled in synchronization with the reference signal, the counter circuit performs a count operation, and the decoder decodes the counter output.

18. A circuit comprising:
   a test device to receive a data signal in response to a reference signal; and
   a setup/hold measuring circuit comprising:
      a signal generator circuit to generate a plurality of internal signals having different phases in response to an external clock signal;
      a selection circuit to sequentially select the internal signals in response to selection signals, so as to generate a multiphase signal;
      a first switch circuit to generate the external clock signal and the multiphase signal as the reference signal and the data signal, respectively, in response to setup/hold enable signals;
      a detection circuit to detect whether an output of the test device indicates a valid value of the data signal, and to generate first and second control signals as a detected result;
      a counter circuit to perform a count operation in response to the first control signal from the detection circuit;
      a decoder circuit to select the selection signals by decoding an output of the counter in response to the first control signal from the detection circuit; and
      a second switch circuit to switch the counter output between the decoder or a plurality of pads in response to the second control signal.

19. The circuit of claim 18, wherein when the output of the test device indicates the valid value of the data signal, the first control signal toggles in synchronization with the reference signal, and the second control signal is logically low.

20. The circuit of claim 18, wherein when the output of the test device indicates an invalid value, the first control signal is logically low and the second control signal toggles in synchronization with the reference signal.

* * * * *

UNITED STATES PATENT AND TRADEMARK OFFICE
CERTIFICATE OF CORRECTION

PATENT NO. : 7,348,789 B2 Page 1 of 1
APPLICATION NO. : 10/972119
DATED : March 25, 2008
INVENTOR(S) : Jong-Eon Lee et al.

It is certified that error appears in the above-identified patent and that said Letters Patent is hereby corrected as shown below:

Column 6, line 3, the word "CMI_SETUP" should read -- CMD_SETUP --;
Column 7, line 37, the word "CMID_SETUP" should read -- CMD_SETUP --;
Column 9, line 11, the word "DLYI" should read -- DLY1 --.

Signed and Sealed this

Fourth Day of November, 2008

JON W. DUDAS
*Director of the United States Patent and Trademark Office*